(12) United States Patent
Sugawara

(10) Patent No.: US 12,553,132 B2
(45) Date of Patent: Feb. 17, 2026

(54) GAS SUPPLY SYSTEM, SUBSTRATE PROCESSING APPARATUS, AND OPERATION METHOD FOR GAS SUPPLY SYSTEM

(71) Applicant: Tokyo Electron Limited, Tokyo (JP)

(72) Inventor: Eiichi Sugawara, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 182 days.

(21) Appl. No.: 18/555,432

(22) PCT Filed: Apr. 13, 2022

(86) PCT No.: PCT/JP2022/017694
§ 371 (c)(1),
(2) Date: Oct. 13, 2023

(87) PCT Pub. No.: WO2022/224887
PCT Pub. Date: Oct. 27, 2022

(65) Prior Publication Data
US 2024/0191356 A1 Jun. 13, 2024

(30) Foreign Application Priority Data

Apr. 21, 2021 (JP) .................................. 2021-071667

(51) Int. Cl.
*C23C 16/40* (2006.01)
*C23C 16/455* (2006.01)
(Continued)

(52) U.S. Cl.
CPC .. *C23C 16/45557* (2013.01); *H01L 21/67017* (2013.01); *C23C 16/4583* (2013.01); *C23C 16/466* (2013.01); *C23C 16/505* (2013.01)

(58) Field of Classification Search
CPC .......... C23C 16/45557; C23C 16/4583; C23C 16/466; H01L 21/3065; H01L 21/67109; H01L 21/67098; H01J 37/3272
See application file for complete search history.

(56) References Cited

U.S. PATENT DOCUMENTS

2002/0195423 A1* 12/2002 Patel ...................... B82Y 30/00
216/73
2013/0048609 A1* 2/2013 Ito ............................. B08B 3/08
118/712
(Continued)

FOREIGN PATENT DOCUMENTS

| JP | H07-249586 A | 9/1995 |
| JP | 2015-041451 A | 3/2015 |

(Continued)

OTHER PUBLICATIONS

International Search Report issued in PCT/JP2022/017694; mailed Jun. 21, 2022.

*Primary Examiner* — Kelsey E Cary
(74) *Attorney, Agent, or Firm* — Studebaker Brackett PLLC

(57) ABSTRACT

A disclosed gas supply system includes a gas supply line and a gas recovery line. The gas supply line supplies a heat transfer gas to a gap between a substrate support and a back surface of a substrate. The gas supply line includes first to third portions and a pressure controller. The second portion extends downstream of the first portion. The pressure controller regulates a pressure of the heat transfer gas and is connected between the first portion and the second portion. The third portion connects the second portion and the gap. The gas recovery line is connected to the first and second portions. The gas recovery line includes a pump connected between the first and the second portions. The gas recovery line shares the third portion with the gas supply line. The gas (Continued)

recovery line returns the heat transfer gas from the second portion to the first portion.

14 Claims, 16 Drawing Sheets

(51) Int. Cl.
*H01L 21/67* (2006.01)
*C23C 16/458* (2006.01)
*C23C 16/46* (2006.01)
*C23C 16/505* (2006.01)

(56) References Cited

U.S. PATENT DOCUMENTS

| | | | |
|---|---|---|---|
| 2016/0079105 A1* | 3/2016 | Parkhe | H01L 21/6833 |
| | | | 137/561 A |
| 2018/0269090 A1* | 9/2018 | Kobayashi | H01L 21/6831 |
| 2023/0112125 A1* | 4/2023 | Kale | F25B 41/40 |
| | | | 62/126 |

FOREIGN PATENT DOCUMENTS

| | | | |
|---|---|---|---|
| JP | 2017-530545 A | 10/2017 | |
| KR | 10-2004-0017792 A | 2/2004 | |
| KR | 10-2014-0089536 A | 7/2014 | |
| WO | 2016/039899 A1 | 3/2016 | |

\* cited by examiner

GAS SUPPLY SYSTEM, SUBSTRATE PROCESSING APPARATUS, AND OPERATION METHOD FOR GAS SUPPLY SYSTEM

TECHNICAL FIELD

Exemplary embodiments of the present disclosure relate to a gas supply system, a substrate processing apparatus, and an operation method for a gas supply system.

BACKGROUND ART

A substrate processing apparatus is used for processing a substrate. Patent Literature 1 discloses a plasma processing apparatus as a type of the substrate processing apparatus. The plasma processing apparatus includes a chamber and a placement table. The placement table is provided inside the chamber. The placement table is configured to support the substrate placed on the placement table. The plasma processing apparatus is configured to supply a heat transfer gas to a gap between the placement table and the substrate in order to promote heat exchange between the placement table and the substrate.

CITATION LIST

Patent Literature

[Patent Literature 1] Japanese Unexamined Patent Publication No. 2015-41451

SUMMARY OF INVENTION

Technical Problem

The present disclosure provides a technology to reduce consumption of a heat transfer gas.

Solution to Problem

In an exemplary embodiment, a gas supply system is provided. The gas supply system includes a gas supply line and a gas recovery line. The gas supply line is configured to supply a heat transfer gas to a gap between a substrate support and a back surface of a substrate. The gas supply line includes a first portion, a second portion, a third portion, and a pressure controller. The second portion extends downstream of the first portion. The pressure controller is configured to regulate a pressure of the heat transfer gas and connected between the first portion and the second portion. The third portion connects the second portion and the gap. The gas recovery line is connected to the first portion and the second portion. The gas recovery line includes a pump that is connected between the first portion and the second portion. The gas recovery line shares the third portion with the gas supply line. The gas recovery line is configured to return the heat transfer gas from the second portion to the first portion.

Advantageous Effects of Invention

According to the exemplary embodiment, it is possible to reduce consumption of a heat transfer gas.

DESCRIPTION OF EMBODIMENTS

Figure 1:
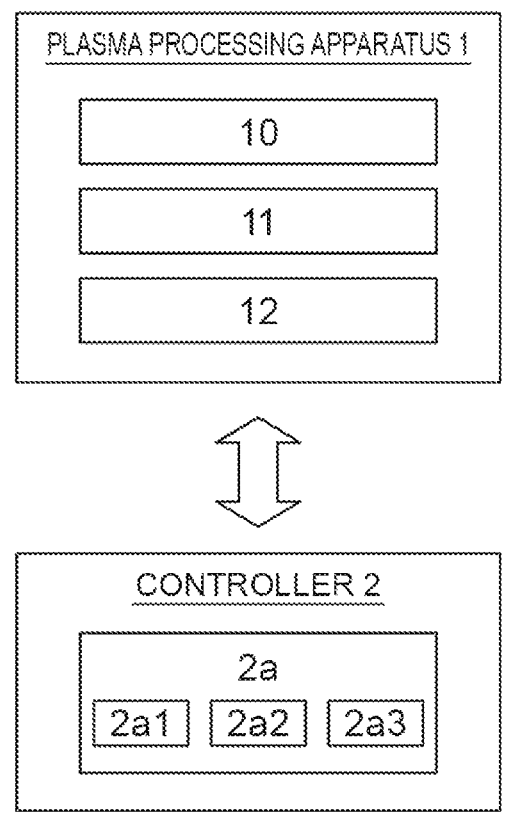
FIG. 1 is a diagram schematically showing a substrate processing apparatus according to an exemplary embodiment.

Hereinafter, various exemplary embodiments will be described.

In an exemplary embodiment, a gas supply system is provided. The gas supply system includes a gas supply line and a gas recovery line. The gas supply line is configured to supply a heat transfer gas to a gap between a substrate support and a back surface of a substrate. The gas supply line includes a first portion, a second portion, a third portion, and a pressure controller. The second portion extends downstream of the first portion. The pressure controller is configured to regulate a pressure of the heat transfer gas and connected between the first portion and the second portion. The third portion connects the second portion and the gap. The gas recovery line is connected to the first portion and the second portion. The gas recovery line includes a pump that is connected between the first portion and the second portion. The gas recovery line shares the third portion with the gas supply line. The gas recovery line is configured to return the heat transfer gas from the second portion to the first portion.

According to the embodiment described above, the heat transfer gas supplied to the gap between the substrate support and the back surface of the substrate W is returned to the first portion of the gas supply line, and used again. Accordingly, the consumption of the heat transfer gas is reduced. In addition, the gas supply line and the gas recovery line share the third portion with each other, and the heat transfer gas is returned from the second portion connected to the third portion to the first portion. Accordingly, an unintended increase in the pressure of the gas in the third portion and the gap can be prevented.

In an exemplary embodiment, the gas recovery line may further include a gas flow path connected between the second portion and the pump and an orifice that reduces a cross-sectional area of the gas flow path.

In an exemplary embodiment, the gas recovery line may further include another gas flow path connected between the second portion and the pump.

In an exemplary embodiment, the gas recovery line may further include a gas flow path connected between the second portion and the pump, and a valve configured to regulate an opening degree of the gas flow path. In an exemplary embodiment, the opening degree of the valve may be set to an opening degree smaller than full opening when the heat transfer gas is supplied from the gas supply line to the gap.

In an exemplary embodiment, the third portion may include a valve connected between the second portion and the substrate support.

In an exemplary embodiment, the first portion may include a tank for storing the heat transfer gas. The gas recovery line may be configured to return the heat transfer gas to the tank.

In an exemplary embodiment, the gas supply system may further include a pressure regulator. The pressure regulator is configured to regulate a pressure of the heat transfer gas in a portion upstream of the pressure controller in the gas supply line. In an exemplary embodiment, the pressure regulator may include a pressure gauge and a valve. The pressure gauge is configured to measure a pressure of the heat transfer gas inside the tank. The valve is connected between a source of the heat transfer gas and the first portion, and opened and closed according to the pressure measured by the pressure gauge.

In an exemplary embodiment, the pressure regulator may set the pressure in the portion upstream of the pressure controller in the gas supply line to a pressure higher than a required supply pressure of the pressure controller.

In an exemplary embodiment, the gas supply system may further include an other gas supply line and an other gas recovery line. The other gas supply line is configured to supply the heat transfer gas to the gap. The other gas supply line includes the first portion, an other second portion, an other pressure controller and an other third portion. The other second portion extends downstream of the first portion. The other pressure controller is configured to regulate the pressure of the heat transfer gas and connected between the first portion and the other second portion. The other third portion connects the other second portion and the gap. The other gas recovery line connects the first portion and the other second portion. The other gas recovery line is connected between the first portion and the other second portion. The other gas recovery line is configured to return the heat transfer gas from the other second portion to the first portion.

In another exemplary embodiment, a substrate processing apparatus is provided. The substrate processing apparatus includes a substrate support and the gas supply system according to any one of the above-described exemplary embodiments. The substrate support is configured to support a substrate placed thereon. The gas supply system is configured to supply a heat transfer gas to a gap between the substrate support and a back surface of the substrate.

In still another exemplary embodiment, an operation method for the gas supply system according to any one of the above-described exemplary embodiments. The operation method includes supplying the heat transfer gas to the gap through the gas supply line. The operation method further includes recovering a part of the heat transfer gas from the second portion to the first portion through the gas recovery line when the heat transfer gas is supplied to the gap.

Hereinafter, various exemplary embodiments will be described in detail with reference to the drawings. In the drawings, the same or equivalent portions are denoted by the same reference symbols.

Figure 2:
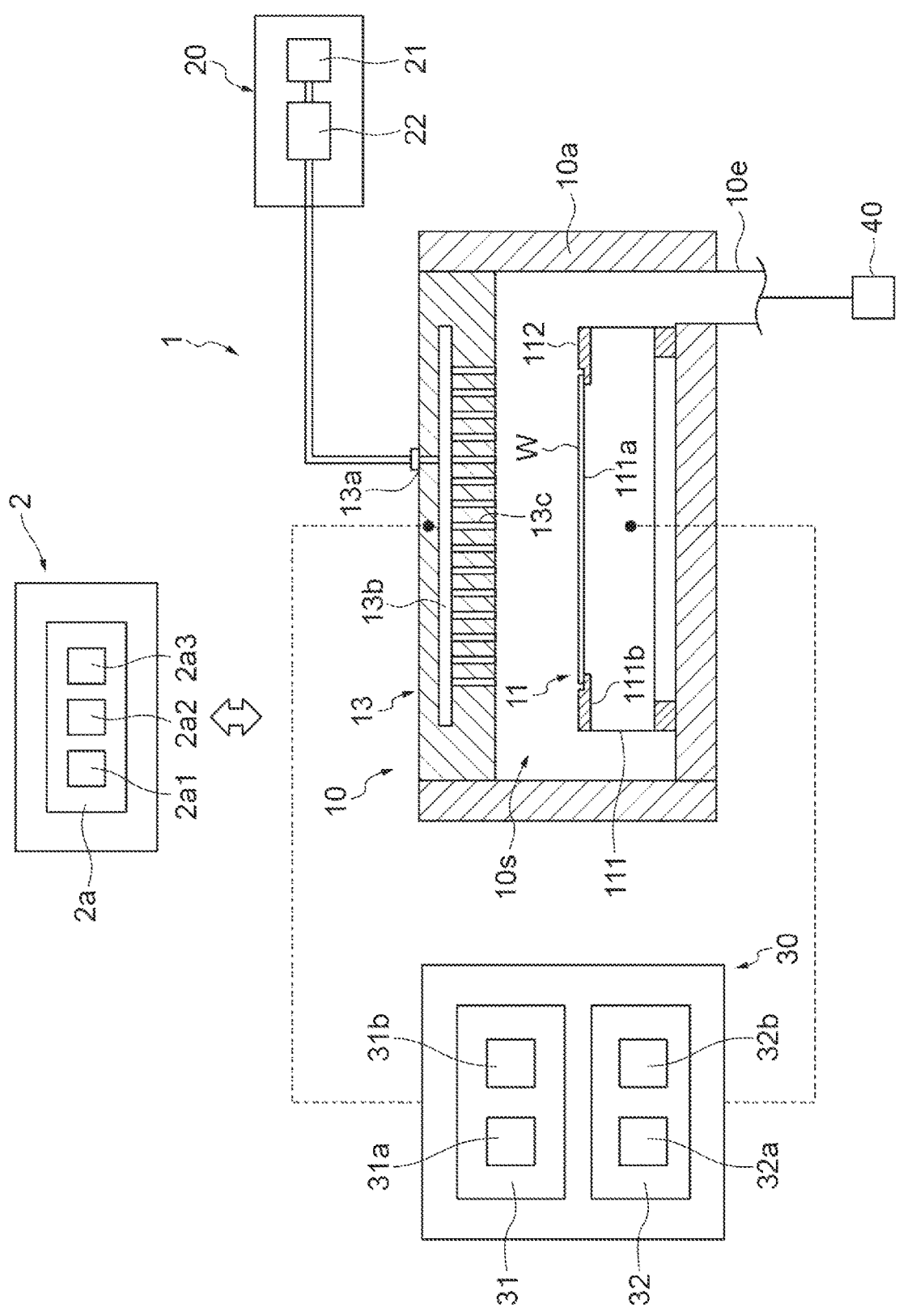
FIG. 2 is a diagram schematically showing the substrate processing apparatus according to an exemplary embodiment.

FIGS. 1 and 2 are a diagram schematically showing a substrate processing apparatus according to an exemplary embodiment. In one embodiment, the substrate processing apparatus is a plasma processing system.

In an embodiment, the plasma processing system includes a plasma processing apparatus 1 and a controller 2. The plasma processing apparatus 1 includes a plasma processing chamber 10, a substrate support 11, and a plasma generator 12. The plasma processing chamber 10 has a plasma processing space. The plasma processing chamber 10 further has at least one gas inlet for supplying at least one process gas into the plasma processing space and at least one gas outlet for exhausting gases from the plasma processing space. The gas inlet is connected to a gas supply 20 described below and the gas outlet is connected to a gas exhaust system 40 described below. The substrate support 11 is disposed in a plasma processing space and has a substrate supporting surface for supporting a substrate.

The plasma generator 12 is configured to generate a plasma from the at least one process gas supplied into the plasma processing space. The plasma formed in the plasma processing space may be, for example, a capacitively coupled plasma (CCP), an inductively coupled plasma (ICP), an electron-cyclotron-resonance (ECR) plasma, a helicon wave plasma (HWP), or a surface wave plasma (SWP). Various types of plasma generators may also be used, such as an alternating current (AC) plasma generator and a direct current (DC) plasma generator. In an embodiment, AC signal (AC power) used in the AC plasma generator has a frequency in a range of 100 kHz to 10 GHz. Hence, examples of the AC signal include a radio frequency (RF) signal and a microwave signal. In an embodiment, the RF signal has a frequency in a range of 100 kHz to 150 MHz.

The controller 2 processes computer executable instructions causing the plasma processing apparatus 1 to perform various steps described in this disclosure. The controller 2 may be configured to control individual components of the plasma processing apparatus 1 such that these components execute the various steps. In an embodiment, the functions of the controller 2 may be partially or entirely incorporated into the plasma processing apparatus 1. The controller 2 may include, for example, a computer 2a. The computer 2a may include, for example, a processor 2a1, a storage 2a2, and a communication interface 2a3. The processor 2a1 may be configured to perform various controlling operations based on a program stored in the storage 2a2. The storage 2a2 may include a random access memory (RAM), a read only memory (ROM), a hard disk drive (HDD), a solid state drive (SSD), or any combination thereof. The communication interface 2a3 can communicate with the plasma processing apparatus 1 via a communication line, such as a local area network (LAN).

An example configuration of a capacitively coupled plasma processing apparatus, which is an example of the plasma processing apparatus 1, will now be described. The capacitively coupled plasma processing apparatus 1 includes a plasma processing chamber 10, a gas supply 20, an electric power source 30, and a gas exhaust system 40. The plasma processing apparatus 1 further includes a substrate support 11 and a gas introduction unit. The gas introduction unit is configured to introduce at least one process gas into the plasma processing chamber 10. The gas introduction unit includes a showerhead 13. The substrate support 11 is disposed in a plasma processing chamber 10. The showerhead 13 is disposed above the substrate support 11. In an embodiment, the showerhead 13 functions as at least part of the ceiling of the plasma processing chamber 10. The plasma processing chamber 10 has a plasma processing space 10s that is defined by the showerhead 13, the sidewall 10a of the plasma processing chamber 10, and the substrate support 11. The sidewall 10a is grounded. The showerhead 13 and the substrate support 11 are electrically insulated from the housing of the plasma processing chamber 10.

The substrate support 11 includes a body 111 and a ring assembly 112. The body 111 has a central region (substrate supporting surface) 111a for supporting a substrate (wafer) W and an annular region (ring supporting surface) 111b for supporting the ring assembly 112. The annular region 111b of the body 111 surrounds the central region 111a of the body 111 in plan view. The substrate W is disposed on the central region 111a of the body 111, and the ring assembly 112 is disposed on the annular region 111b of the body 111 so as to surround the substrate W on the central region 111a of the body 111. In an embodiment, the body 111 includes a base and an electrostatic chuck. The base includes a conductive member. The conductive member of the base functions as a lower electrode. The electrostatic chuck is disposed on the base. An upper surface of the electrostatic chuck has a substrate supporting surface 111a. The ring assembly 112 includes one or more annular members. At least one of the one or more annular members is an edge ring. Although illustration thereof is omitted, the substrate support 11 may also include a temperature adjusting module that is configured to adjust at least one of the electrostatic chuck, the ring assembly, and the substrate W to a target temperature. The temperature adjusting module may include a heater, a heat transfer medium, a flow passage, or any combination thereof. A heat transfer fluid, such as brine or gas, flows into the flow passage.

The showerhead 13 is configured to introduce at least one process gas from the gas supply 20 into the plasma processing space 10s. The showerhead 13 has at least one gas inlet 13a, at least one gas diffusing space 13b, and a plurality of gas feeding ports 13c. The process gas supplied to the gas inlet 13a passes through the gas diffusing space 13b and is then introduced into the plasma processing space 10s from the gas feeding ports 13c. The showerhead 13 includes a conductive member. The conductive member of the showerhead 13 functions as an upper electrode. The gas introduction unit may include one or more side gas injectors (SGI) provided at one or more openings formed in the sidewall 10a, in addition to the showerhead 13.

The gas supply 20 may include at least one gas source 21 and at least one flow controller 22. In an embodiment, the gas supply 20 is configured to supply at least one process gas from the corresponding gas source 21 through the corresponding flow controller 22 into the showerhead 13. Each flow controller 22 may be, for example, a mass flow controller or a pressure-controlled flow controller. The gas supply 20 may include a flow modulation device that can modulate or pulse the flow of the at least one process gas.

The electric power source 30 include an RF source 31 coupled to the plasma processing chamber 10 through at least one impedance matching circuit. The RF source 31 is configured to supply at least one RF signal (RF power) to the conductive member of the substrate support 11 and/or the conductive member of the showerhead 13. A plasma is thereby formed from at least one process gas supplied into the plasma processing space 10s. Thus, the RF source 31 can function as at least part of the plasma generator 12. The bias RF signal supplied to the conductive member of the substrate support 11 causes a bias potential to occur in the substrate W, which potential then attracts ionic components in the plasma to the substrate W.

In an embodiment, the RF source 31 includes a first RF generator 31a and a second RF generator 31b. The first RF generator 31a is coupled to the conductive member of the substrate support 11 and/or the conductive member of the showerhead 13 and is configured to generate a source RF signal (source RF power) for generating a plasma. In an embodiment, the source RF signal has a frequency in a range of 13 MHz to 150 MHz. In an embodiment, the first RF generator 31a may be configured to generate a plurality of source RF signals having different frequencies. The resulting source RF signal(s) is supplied to the conductive member of the substrate support 11 and/or the conductive member of the showerhead 13. The second RF generator 31b is coupled to the conductive member of the substrate support 11 and is configured to generate a bias RF signal (bias RF power). In an embodiment, the bias RF signal has a frequency which is less than that of the source RF signal. In an embodiment, the bias RF signal has a frequency in a range of 400 kHz to 13.56 MHz. In an embodiment, the second RF generator 31b may be configured to generate a plurality of bias RF signals having different frequencies. The resulting bias RF signal(s) is supplied to the conductive member of the substrate support 11. In various embodiments, at least one of the source RF signal and the bias RF signal may be pulsed.

The electric power source 30 may also include a DC source 32 coupled to the plasma processing chamber 10. The DC source 32 includes a first DC generator 32a and a second DC generator 32b. In an embodiment, the first DC generator 32a is connected to the conductive member of the substrate support 11 and is configured to generate a first DC signal. The resulting first DC signal is applied to the conductive member of the substrate support 11. In an embodiment, the second DC generator 32b is connected to the conductive member of the showerhead 13 and is configured to generate a second DC signal. The resulting second DC signal is applied to the showerhead 13. In various embodiments, the first and second DC signals may be pulsed. The first and second DC generators 32a, 32b may be disposed in addition to the RF source 31, or the first DC generator 32a may be disposed in place of the second RF generator 31b.

The gas exhaust system 40 may be connected to, for example, a gas outlet 10e provided in the bottom wall of the plasma processing chamber 10. The gas exhaust system 40 may include a pressure regulation valve and a vacuum pump. The pressure regulation valve enables the pressure in the plasma processing space 10s to be adjusted. The vacuum pump may include a turbo-molecular pump, a dry pump, or a combination thereof.

Figure 3:
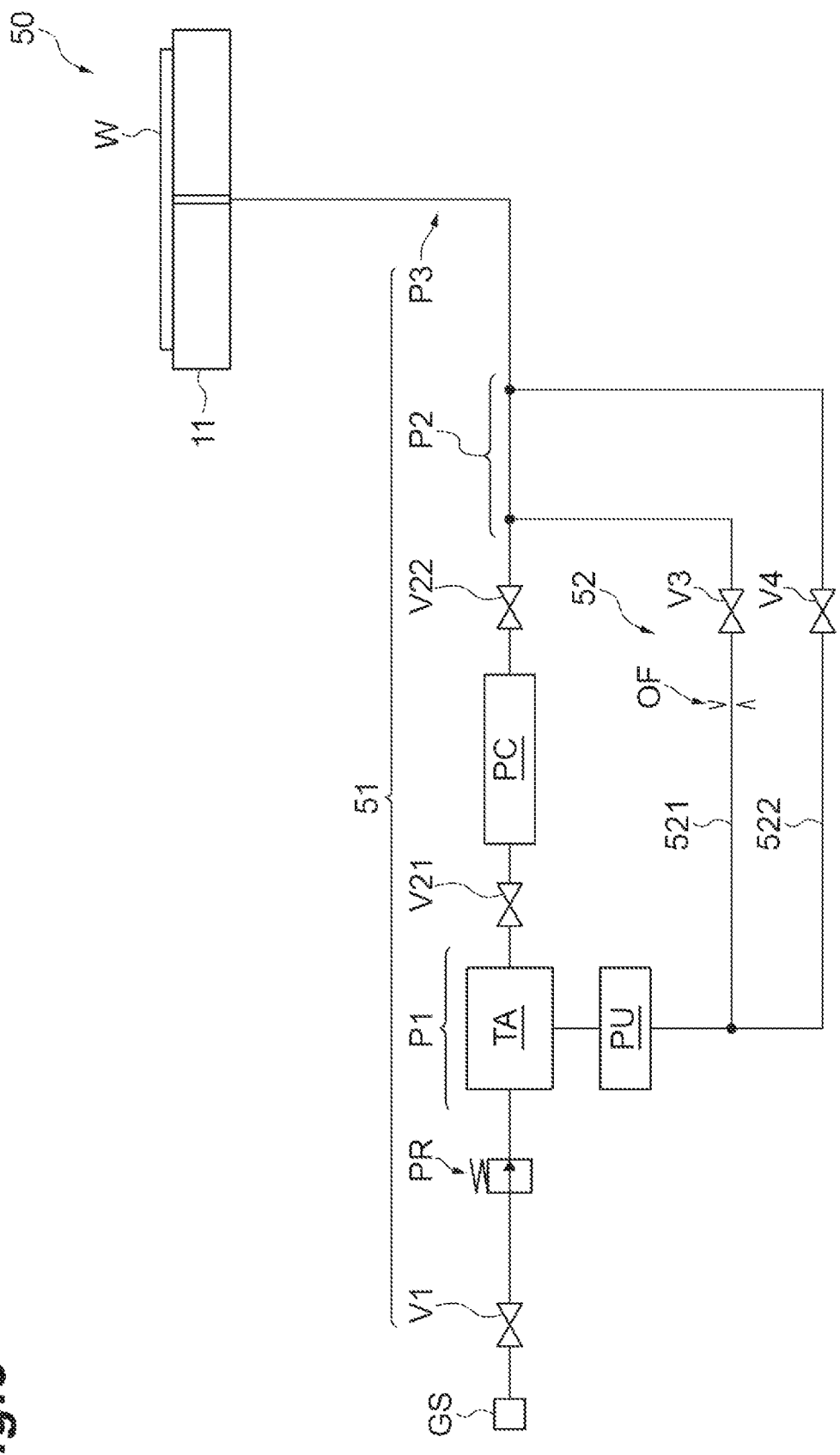
FIG. 3 is a diagram showing a gas supply system according to an exemplary embodiment.

Hereinafter, the description is made with reference to FIG. 3. FIG. 3 is a diagram showing a gas supply system according to an exemplary embodiment. A gas supply system 50 shown in FIG. 3 can be adopted in, for example, a substrate processing apparatus such as the plasma processing apparatus 1.

The gas supply system 50 includes a gas supply line 51 and a gas recovery line 52. The gas supply line 51 is configured to supply the heat transfer gas (for example, helium gas) to a gap between the substrate support 11 and a back surface of the substrate W. The gas supply line 51 includes a first portion P1, a second portion P2, a third portion P3, and a pressure controller PC.

The first portion P1 provides a gas flow path connected to a source GS of the heat transfer gas. The second portion P2 is downstream of the first portion P1. The second portion P2 provides a gas flow path of the heat transfer gas. The pressure controller PC is connected between the first portion P1 and the second portion P2. The third portion P3 is downstream of the second portion P2, and provides a gas flow path of the heat transfer gas. The third portion P3 connects the second portion P2 and the gap between the substrate support 11 and the back surface of the substrate W to each other. In the gas supply line 51, the heat transfer gas is supplied from the source GS to the gap between the substrate support 11 and the back surface of the substrate W through the first portion P1, the pressure controller PC, the second portion P2, and the third portion P3.

In the embodiment, the first portion P1 may include a tank TA. The tank TA is a container in which the heat transfer gas is stored. In the embodiment, a valve V1 and a pressure regulator PR may be connected between the first portion P1 and the source GS. The valve V1 may be an on-off valve or may be a valve of which an opening degree can be regulated.

The pressure regulator PR is configured to regulate a pressure of the heat transfer gas in a portion upstream of (on a primary side with respect to) the pressure controller PC in the gas supply line 51. In the embodiment, the pressure regulator PR may be a pressure regulator. The pressure regulator PR can set the pressure of the heat transfer gas in the portion upstream of the pressure controller PC in the gas supply line 51 to a pressure higher than a required supply pressure of the pressure controller PC. The required supply pressure of the pressure controller PC can be equal to or higher than a maximum pressure of the heat transfer gas output from the pressure controller PC. The pressure of the heat transfer gas output from the pressure regulator PR to the portion upstream of the pressure controller PC in the gas supply line 51 is designated by, for example, the controller 2 to the pressure regulator PR.

The pressure controller PC is configured to control the pressure of the heat transfer gas output downstream of (to a secondary side with respect to) the gas supply line 51. The pressure of the heat transfer gas output downstream of the pressure controller PC is designated, for example, by the controller 2 to the pressure controller PC.

In the embodiment, a valve V21 may be connected between the first portion P1 and the pressure controller PC. In addition, a valve V22 may be connected between the pressure controller PC and the second portion P2. Each of the valve V21 and the valve V22 may be an on-off valve or may be a valve of which an opening degree can be regulated.

The gas recovery line 52 is connected to the first portion P1 and the second portion P2. The gas recovery line 52 includes a gas flow path connected between the first portion P1 and the second portion P2. The gas recovery line 52 further includes a pump PU. The pump PU is connected between the first portion P1 and the second portion P2, and forms a part of the gas flow path of the gas recovery line 52. The gas recovery line 52 is configured to return the heat transfer gas from the second portion P2 to the first portion P1. In the embodiment, the gas recovery line 52 is configured to return the heat transfer gas from the second portion P2 to the tank TA. The gas recovery line 52 shares the third portion P3 with the gas supply line 51.

In the embodiment, the gas recovery line 52 may include a first recovery line 521 and a second recovery line 522. The first recovery line 521 provides a gas flow path that connects the second portion P2 and the pump PU. The first recovery line 521 further includes a valve V3 and an orifice OF. The valve V3 and the orifice OF form a part of the gas flow path of the first recovery line 521. The valve V3 may be an on-off valve or may be a valve of which an opening degree can be regulated. The orifice OF reduces a cross-sectional area of the gas flow path of the first recovery line 521.

The second recovery line 522 provides another gas flow path that connects the second portion P2 and the pump PU. In other words, the first recovery line 521 and the second recovery line 522 are connected in parallel between the second portion P2 and the pump PU. The second recovery line 522 further includes a valve V4. The valve V4 forms a part of the gas flow path of the second recovery line 522. The valve V4 may be an on-off valve or may be a valve of which an opening degree can be regulated. It should be noted that the second recovery line 522 does not include an orifice. In other words, a minimum cross-sectional area of the gas flow path of the second recovery line 522 is larger than a minimum cross-sectional area of the gas flow path of the first recovery line 521.

Hereinafter, an operation method for the gas supply system 50 will be described. The operation method includes supplying the heat transfer gas to the gap between the substrate support 11 and the back surface of the substrate W through the gas supply line 51. The operation method further includes recovering a part of the heat transfer gas from the second portion P2 to the first portion P1 through the gas recovery line 52 when the heat transfer gas is supplied to the gap.

Figure 4:
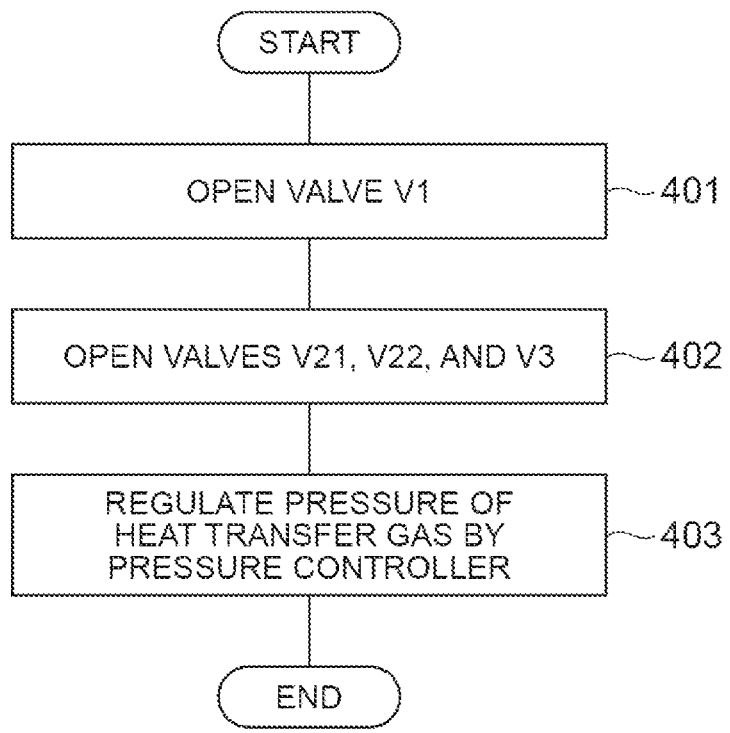
FIG. 4 is a flowchart showing a gas supply sequence according to an exemplary embodiment.

Hereinafter, a gas supply sequence in the operation method for the gas supply system 50 will be described with reference to FIG. 4. FIG. 4 is a flowchart showing the gas supply sequence according to an exemplary embodiment. In the gas supply sequence, each section of the gas supply system 50 may be controlled by the controller 2. By executing the gas supply sequence, the heat transfer gas is supplied to the gap between the substrate support 11 and the back surface of the substrate W through the gas supply line 51. In addition, by executing the gas supply sequence, a part of the heat transfer gas is returned from the second portion P2 to the first portion P1 through the gas recovery line 52.

In the gas supply sequence shown in FIG. 4, first, the valve V1 is opened (step 401). Then, the valve V21, the valve V22, and the valve V3 are opened (step 402). It should be noted that the valve V4 is closed while the gas supply sequence is being executed. Then, the pressure of the heat transfer gas is controlled by the pressure controller PC (step 403). During the execution of the gas supply sequence, the pump PU is operated to return a part of the heat transfer gas from the second portion P2 to the first portion P1. By the gas supply sequence, the heat transfer gas at the designated pressure is supplied to the gap between the substrate support 11 and the back surface of the substrate W. In addition, a part of the heat transfer gas is returned from the second portion P2 to the first portion P1 through the gas recovery line 52.

Figure 5:
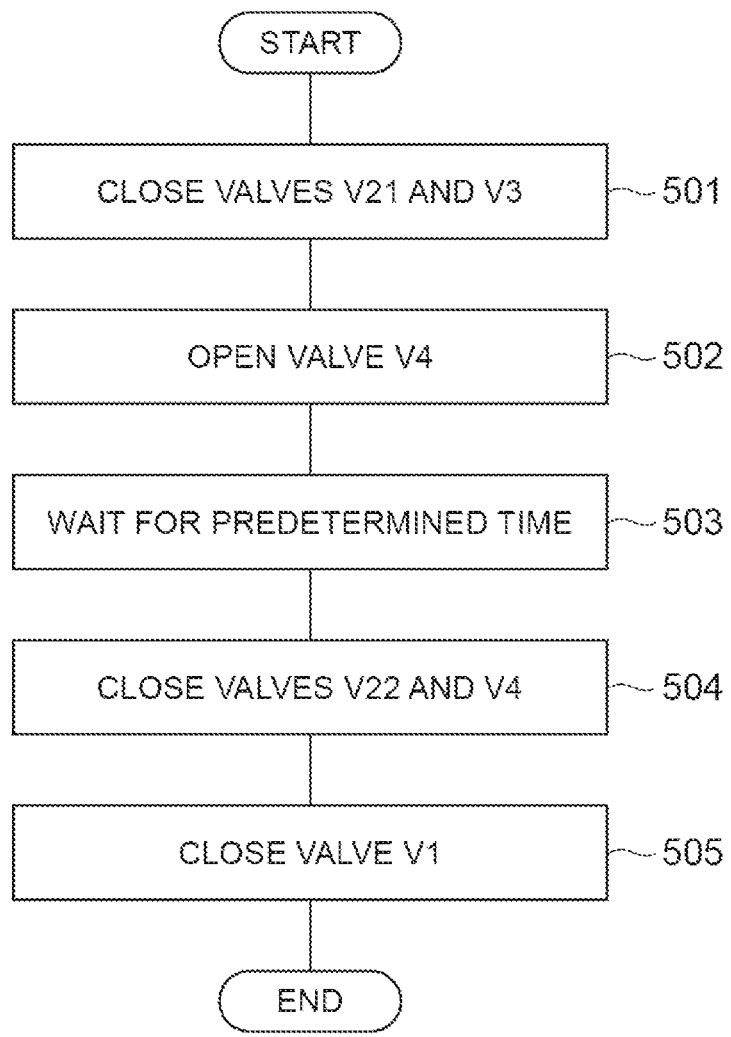
FIG. 5 is a flowchart showing a gas stop sequence according to an exemplary embodiment.

Hereinafter, a gas stop sequence in the operation method for the gas supply system 50 will be described with reference to FIG. 5. FIG. 5 is a flowchart showing the gas stop sequence according to an exemplary embodiment. In the gas stop sequence, each section of the gas supply system 50 may be controlled by the controller 2. By executing the gas stop sequence, the supply of the heat transfer gas by the gas supply system 50 is stopped.

In the gas stop sequence shown in FIG. 5, first, the valve V21 and the valve V3 are closed (step 501). Then, the valve V4 is opened (step 502). After waiting for a desired time (step 503), the valve V22 and the valve V4 are closed (step 504). Then, the valve V1 is closed (step 505). During the execution of the gas stop sequence, the pump PU is operated to return the heat transfer gas to the first portion P1. By the gas stop sequence, the supply of the heat transfer gas to the gap between the substrate support 11 and the back surface of the substrate W is stopped. In addition, the heat transfer gas inside the second portion P2, the third portion P3, and the gas recovery line 52 of the gas supply system 50 is returned to the inside of the first portion P1 (for example, the tank TA).

With the gas supply system 50 described above, the heat transfer gas supplied to the gap between the substrate support 11 and the back surface of the substrate W is returned to the first portion P1 of the gas supply line 51, and used again. Accordingly, the consumption of the heat transfer gas is reduced. In addition, the gas supply line 51 and the gas recovery line 52 share the third portion P3 with each other, and the heat transfer gas is returned from the second portion P2 connected to the third portion P3 to the first portion P1. Accordingly, an unintended increase in the pressure of the gas in the third portion P3 and the gap can be prevented. In addition, the gas line configuration can be simplified by sharing the third portion P3 between the gas supply line 51 and the gas recovery line 52.

In the embodiment, when the heat transfer gas is supplied to the gap between the substrate support 11 and the back surface of the substrate W, a small amount of the heat transfer gas is returned from the second portion P2 to the first portion P1 through the first recovery line 521. On the other hand, when the supply of the heat transfer gas is stopped, the heat transfer gas is returned efficiently from the second portion P2 to the first portion P1 through the second recovery line 522.

Figure 6:
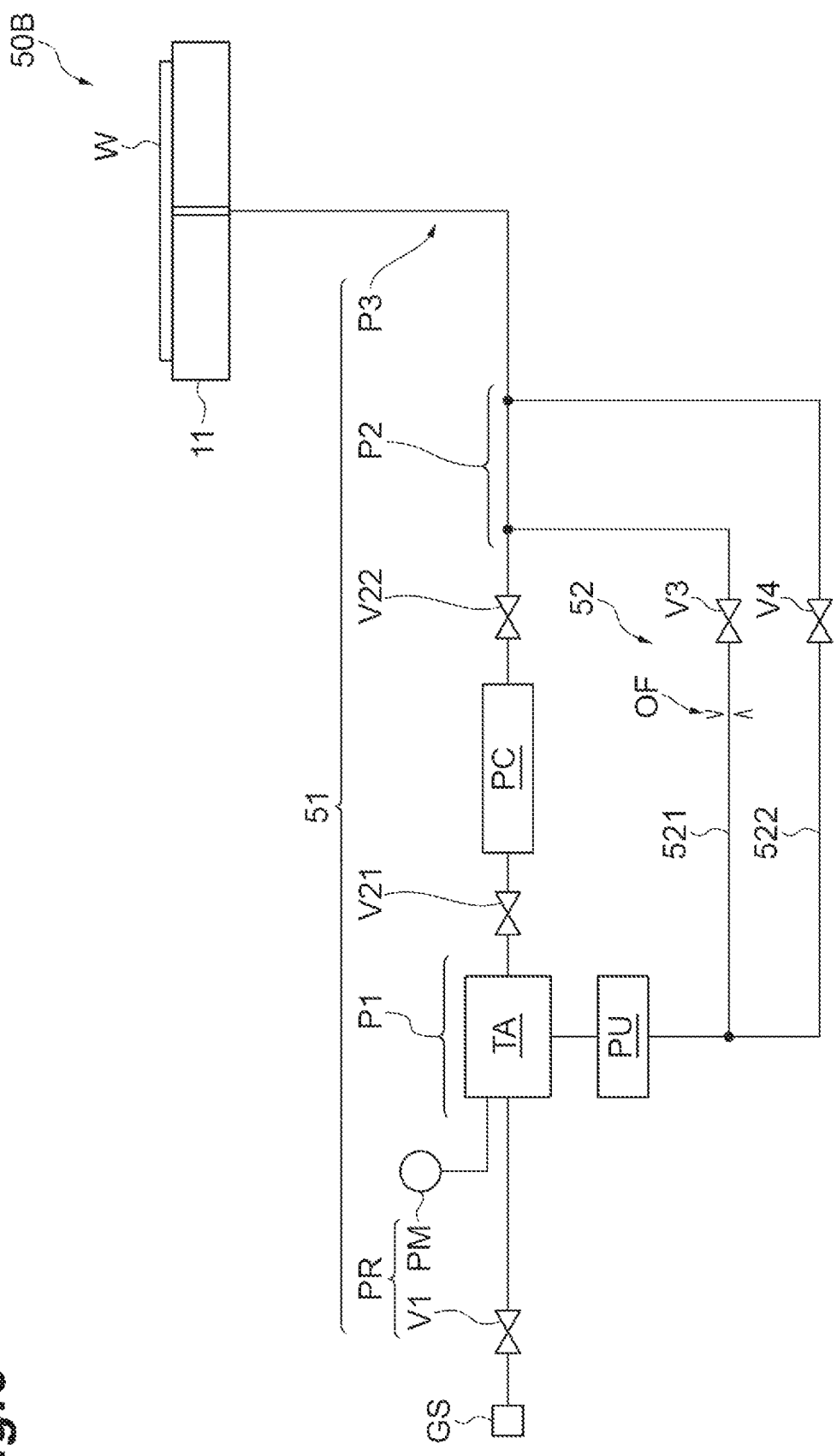
FIG. 6 is a diagram showing a gas supply system according to another exemplary embodiment.

Hereinafter, the description is made with reference to FIG. 6. FIG. 6 is a diagram showing a gas supply system according to another exemplary embodiment. A gas supply system 50B shown in FIG. 6 can be adopted in, for example, a substrate processing apparatus such as the plasma processing apparatus 1. In the gas supply system 50B, the pressure regulator PR includes the valve V1 and a pressure gauge PM. The pressure gauge PM is configured to measure a pressure inside the tank TA. Opening and closing or the opening degree of the valve V1 is controlled by the controller 2 such that the pressure measured by the pressure gauge PM is the designated pressure.

Each of other configurations of the gas supply system 50B is the same as the corresponding configuration of the gas supply system 50. The operation method, the gas supply sequence, and the gas stop sequence described above can also be applied to the gas supply system 50B.

Figure 7:
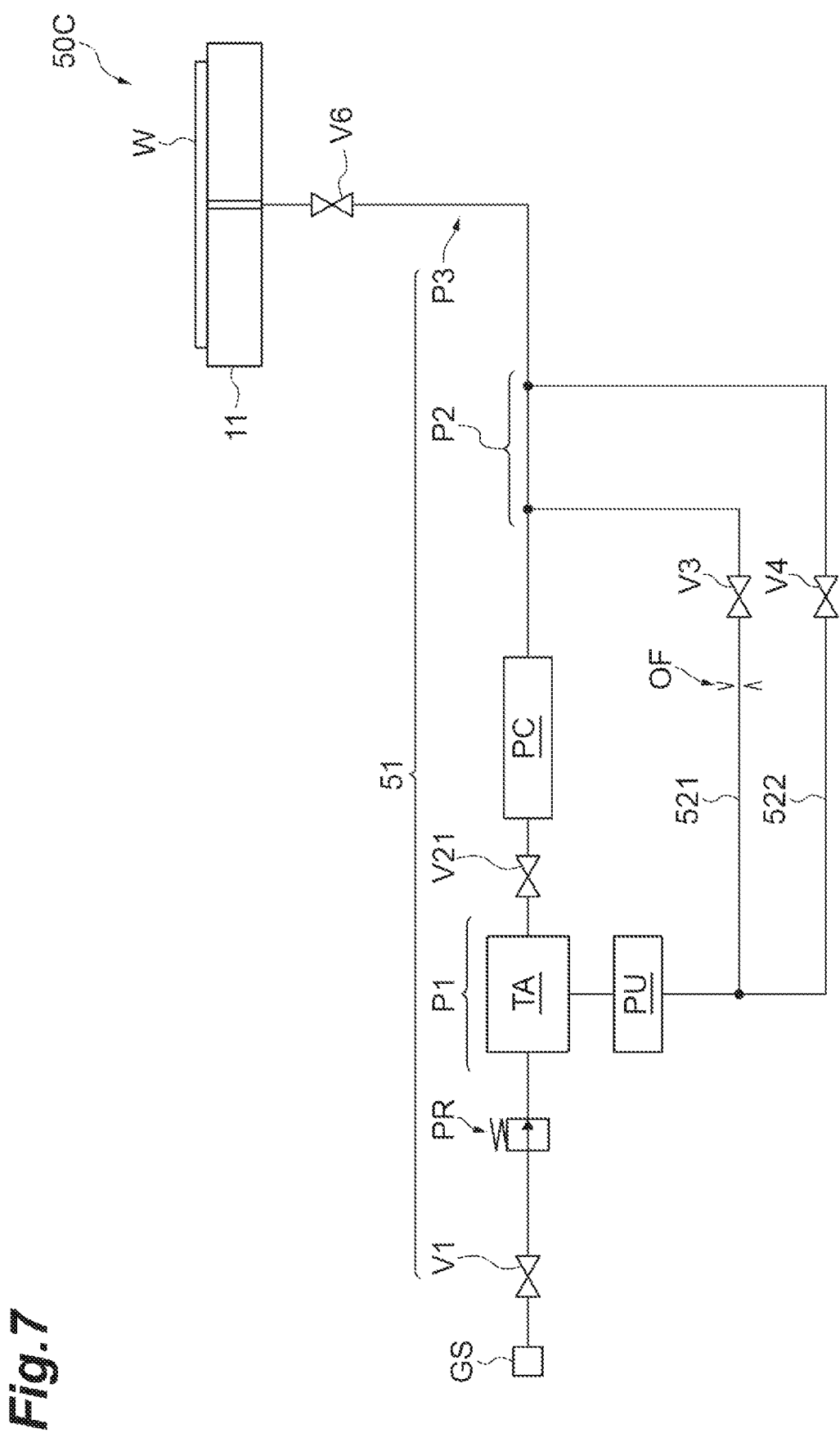
FIG. 7 is a diagram showing a gas supply system according to still another exemplary embodiment.

Hereinafter, the description is made with reference to FIG. 7. FIG. 7 is a diagram showing a gas supply system according to still another exemplary embodiment. A gas supply system 50C shown in FIG. 7 can be adopted in, for example, a substrate processing apparatus such as the plasma processing apparatus 1. The third portion P3 of the gas supply system 50C includes a valve V6. The valve V6 forms a part of the gas flow path of the third portion P3. The valve V6 may be an on-off valve or may be a valve of which an opening degree can be regulated. The gas supply system 50C does not include the valve V22. Each of other configurations of the gas supply system 50C is the same as the corresponding configuration of the gas supply system 50. In addition, the operation method described above can also be applied to the gas supply system 50C.

Figure 8:
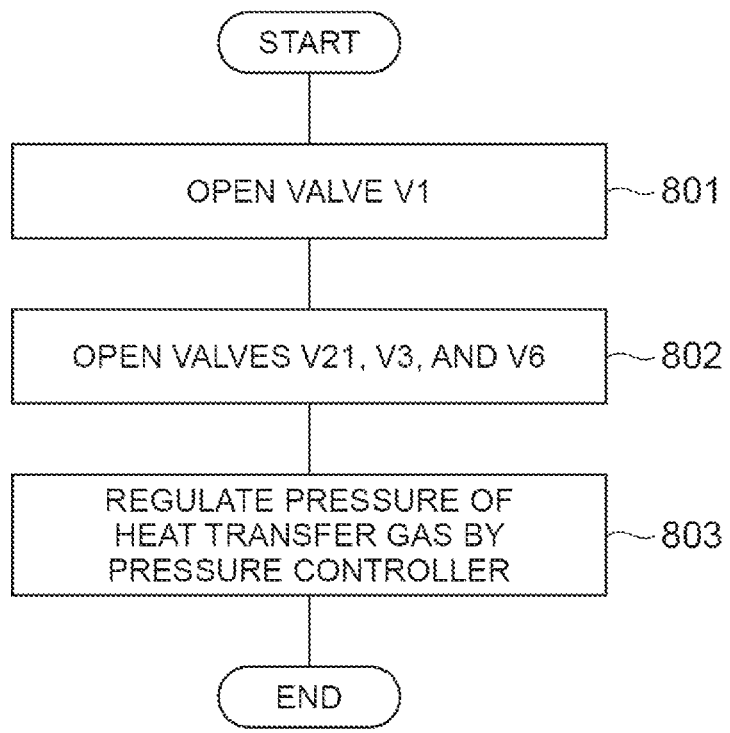
FIG. 8 is a flowchart showing a gas supply sequence according to another exemplary embodiment.

FIG. 8 is a flowchart showing a gas supply sequence according to another exemplary embodiment. As shown in FIG. 8, in the gas supply sequence applied to the gas supply system 50C, first, the valve V1 is opened (step 801). Then, the valve V21, the valve V3, and the valve V6 are opened (step 802). It should be noted that the valve V4 is closed while the gas supply sequence is being executed. Then, the pressure of the heat transfer gas is controlled by the pressure controller PC (step 803). During the execution of the gas supply sequence, the pump PU is operated to return a part of the heat transfer gas from the second portion P2 to the first portion P1.

Figure 9:
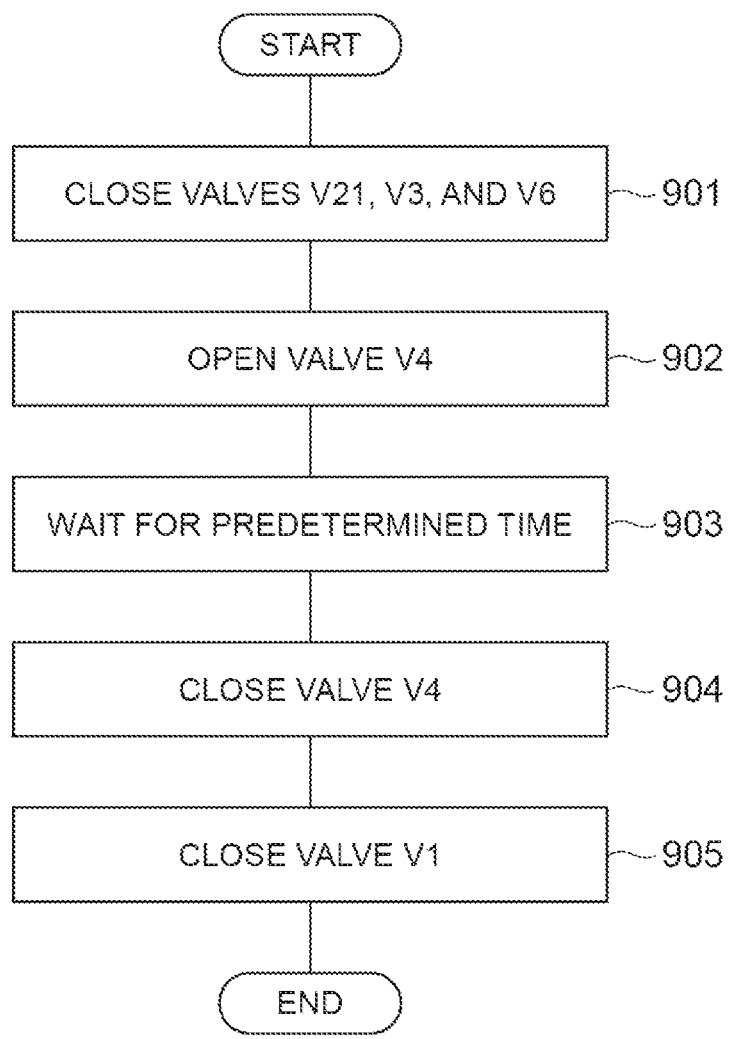
FIG. 9 is a flowchart showing a gas stop sequence according to another exemplary embodiment.

FIG. 9 is a flowchart showing a gas stop sequence according to another exemplary embodiment. As shown in FIG. 9, in the gas stop sequence applied to the gas supply system 50C, the valve V21, the valve V3, and the valve V6 are first closed (step 901). Then, the valve V4 is opened (step 902). After waiting for a desired time (step 903), the valve V4 is closed (step 904). Then, the valve V1 is closed (step 905). During the execution of the gas stop sequence, the pump PU is operated to return the heat transfer gas to the first portion P1. With the gas supply system 50C, the return of the process gas inside the plasma processing chamber 10 to the first portion P1 during the execution of the gas stop sequence is prevented.

Figure 10:
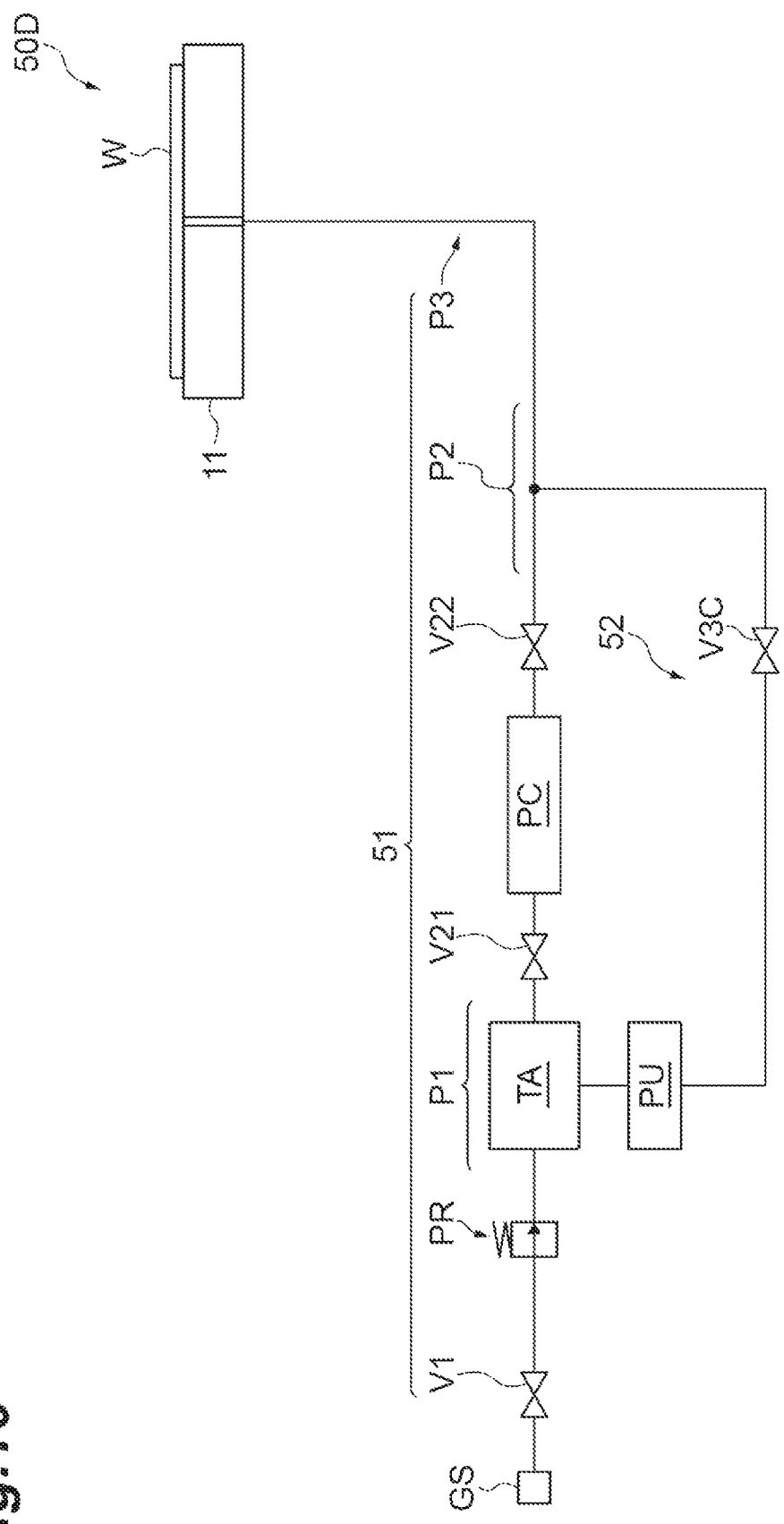
FIG. 10 is a diagram showing a gas supply system according to still another exemplary embodiment.

Hereinafter, the description is made with reference to FIG. 10. FIG. 10 is a diagram showing a gas supply system according to still another exemplary embodiment. A gas supply system 50D shown in FIG. 10 can be adopted in, for example, a substrate processing apparatus such as the plasma processing apparatus 1. In the gas supply system 50D, the gas recovery line 52 does not include the first recovery line 521 and the second recovery line 522, and provides a single gas flow path connected between the second portion P2 and the pump PU. The gas recovery line 52 includes a valve V3C of which an opening degree can be regulated. The valve V3C forms a part of the single gas flow path of the gas recovery line 52. Each of other configurations of the gas supply system 50D is the same as the corresponding configuration of the gas supply system 50. In addition, the operation method described above can also be applied to the gas supply system 50D.

Figure 11:
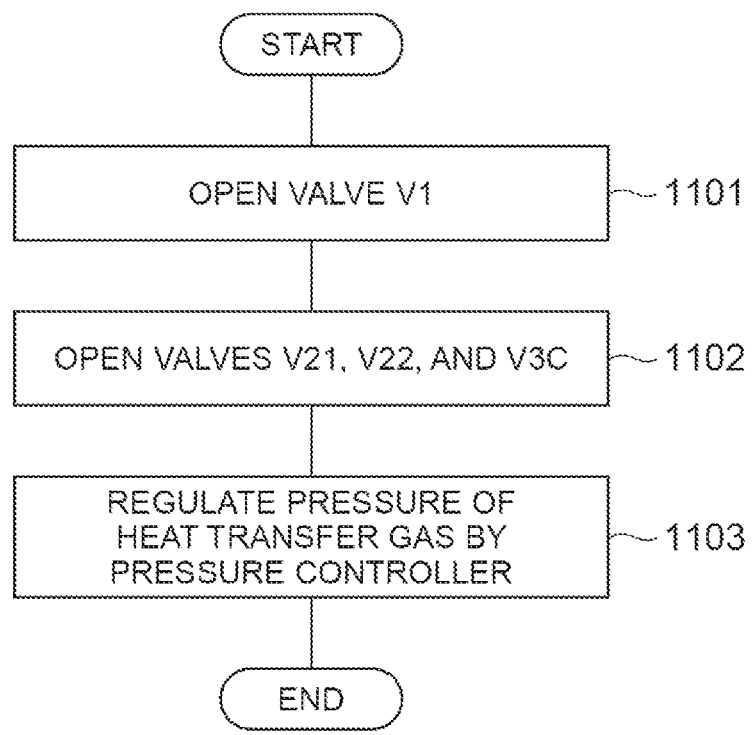
FIG. 11 is a flowchart showing a gas supply sequence according to still another exemplary embodiment.

FIG. 11 is a flowchart showing a gas supply sequence according to still another exemplary embodiment. As shown in FIG. 11, in the gas supply sequence applied to the gas supply system 50D, first, the valve V1 is opened (step 1101). Then, the valve V21, the valve V22, and the valve V3C are opened (step 1102). The opening degree of the valve V3C is set to an opening degree smaller than full opening in order to return a small amount of the heat transfer gas from the second portion P2 to the first portion P1. Then, the pressure of the heat transfer gas is controlled by the pressure controller PC (step 1103). During the execution of the gas supply sequence, the pump PU is operated to return a part of the heat transfer gas from the second portion P2 to the first portion P1.

Figure 12:
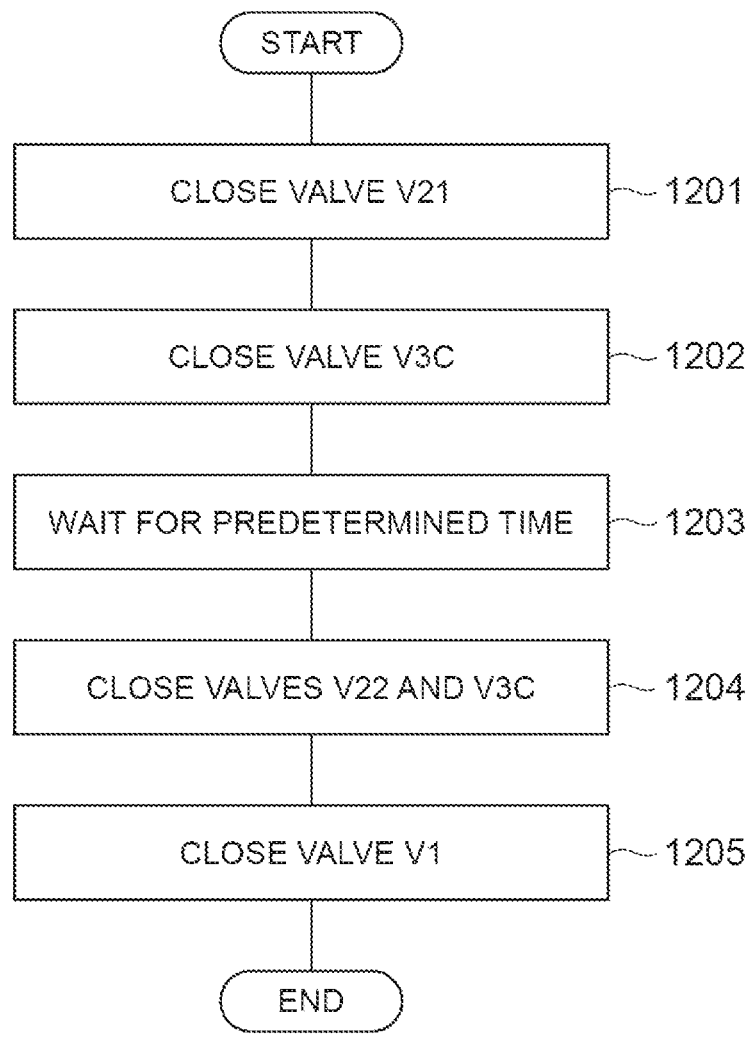
FIG. 12 is a flowchart showing a gas stop sequence according to still another exemplary embodiment.

FIG. 12 is a flowchart showing a gas stop sequence according to still another exemplary embodiment. As shown in FIG. 12, in the gas stop sequence applied to the gas supply system 50D, first, the valve V21 is closed (step 1202). Then, the valve V3C is opened (step 1202). The opening degree of the valve V3C is set to an opening degree higher than the opening degree thereof during the execution of the gas supply sequence, for example, full opening. After waiting for a desired time (step 1203), the valve V22 and the valve V3C are closed (step 1204). Then, the valve V1 is closed (step 1205). During the execution of the gas stop sequence, the pump PU is operated to return the heat transfer gas to the first portion P1.

Figure 13:
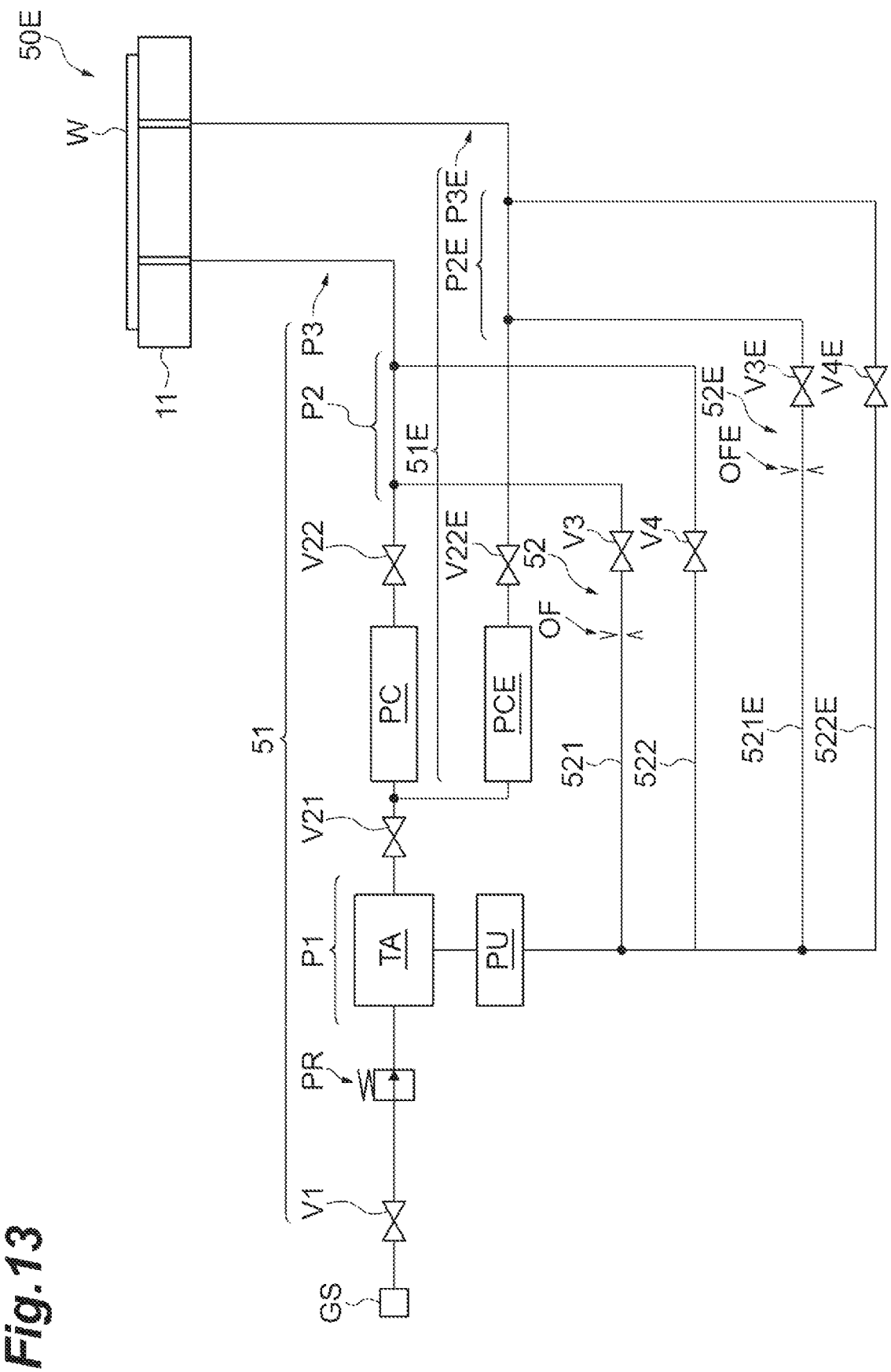
FIG. 13 is a diagram showing a gas supply system according to still another exemplary embodiment.

Hereinafter, the description is made with reference to FIG. 13. FIG. 13 is a diagram showing a gas supply system according to still another exemplary embodiment. A gas supply system 50E shown in FIG. 13 can be adopted in, for example, a substrate processing apparatus such as the plasma processing apparatus 1. The gas supply system 50E further includes a gas supply line 51E and a gas recovery line 52E.

The gas supply line 51E is configured to supply the heat transfer gas to the gap between the substrate support 11 and the back surface of the substrate W, as in the gas supply line 51. The gas supply line 51E includes a second portion P2E, a pressure controller PCE, and a third portion P3E. The gas supply line 51E shares the first portion P1 with the gas supply line 51.

The second portion P2E is downstream of the first portion P1. The second portion P2E provides a gas flow path of the heat transfer gas. The pressure controller PCE is connected between the first portion P1 and the second portion P2E. The pressure controller PCE is configured to control the pressure of the heat transfer gas output downstream of the gas supply line 51E. The pressure of the heat transfer gas output downstream of the pressure controller PCE is designated, for example, by the controller 2 to the pressure controller PCE. In the embodiment, the pressure controller PCE is connected to the first portion P1 through the valve V21. Further, the pressure controller PCE is connected to the second portion P2E through a valve V22E. The valve V22E may be an on-off valve or may be a valve of which an opening degree can be regulated.

The third portion P3E is downstream of the second portion P2E, and provides a gas flow path of the heat transfer gas. The third portion P3E connects the second portion P2E and the gap between the substrate support 11 and the back surface of the substrate W to each other. In the gas supply line 51E, the heat transfer gas is supplied from the source GS to the gap between the substrate support 11 and the back surface of the substrate W through the first portion P1, the pressure controller PCE, the second portion P2E, and the third portion P3E.

The gas recovery line 52E is connected to the first portion P1 and the second portion P2E. The gas recovery line 52E includes a gas flow path connected between the first portion P1 and the second portion P2E. The gas recovery line 52E shares the pump PU with the gas recovery line 52. The pump PU forms a part of the gas flow path of the gas recovery line 52 and a part of the gas flow path of the gas recovery line 52E. The gas recovery line 52E is configured to return the heat transfer gas from the second portion P2E to the first portion P1. In the embodiment, the gas recovery line 52E is configured to return the gas from the second portion P2E to the tank TA. The gas recovery line 52E shares the third portion P3E with the gas supply line 51E.

In the embodiment, the gas recovery line 52E may include a first recovery line 521E and a second recovery line 522E. The first recovery line 521E provides a gas flow path that connects the second portion P2E and the pump PU. The first recovery line 521E further includes a valve V3E and an orifice OFE. The valve V3E and the orifice OFE form a part of the gas flow path of the first recovery line 521E. The valve V3E may be an on-off valve or may be a valve of which an opening degree can be regulated. The orifice OFE reduces a cross-sectional area of the gas flow path of the first recovery line 521E.

The second recovery line 522E provides another gas flow path that connects the second portion P2E and the pump PU. In other words, the first recovery line 521E and the second recovery line 522E are connected in parallel between the second portion P2E and the pump PU. The second recovery line 522E further includes a valve V4E. The valve V4E forms a part of the gas flow path of the second recovery line 522E. The valve V4E may be an on-off valve or may be a valve of which an opening degree can be regulated. It should be noted that the second recovery line 522E does not include an orifice. In other words, a minimum cross-sectional area of the gas flow path of the second recovery line 522E is larger than a minimum cross-sectional area of the gas flow path of the first recovery line 521E.

Each of other configurations of the gas supply system 50E is the same as the corresponding configuration of the gas supply system 50. In addition, the operation method described above can also be applied to the gas supply system 50E. Specifically, the operation method includes supplying the heat transfer gas to the gap between the substrate support 11 and the back surface of the substrate W through the gas supply lines 51 and 51E. The operation method further includes recovering a part of the heat transfer gas from the second portions P2 and P2E to the first portion P1 through the gas recovery lines 52 and 52E when the heat transfer gas is supplied to the gap.

In the gas supply sequence applied to the gas supply system 50E, each section of the gas supply system 50E can be controlled by the controller 2. By executing the gas supply sequence, the heat transfer gas is supplied to the gap between the substrate support 11 and the back surface of the substrate W through the gas supply lines 51 and 51E. In addition, by executing the gas supply sequence, a part of the heat transfer gas is returned from the second portions P2 and P2E to the first portion P1 through the gas recovery lines 52 and 52E.

Figure 14:
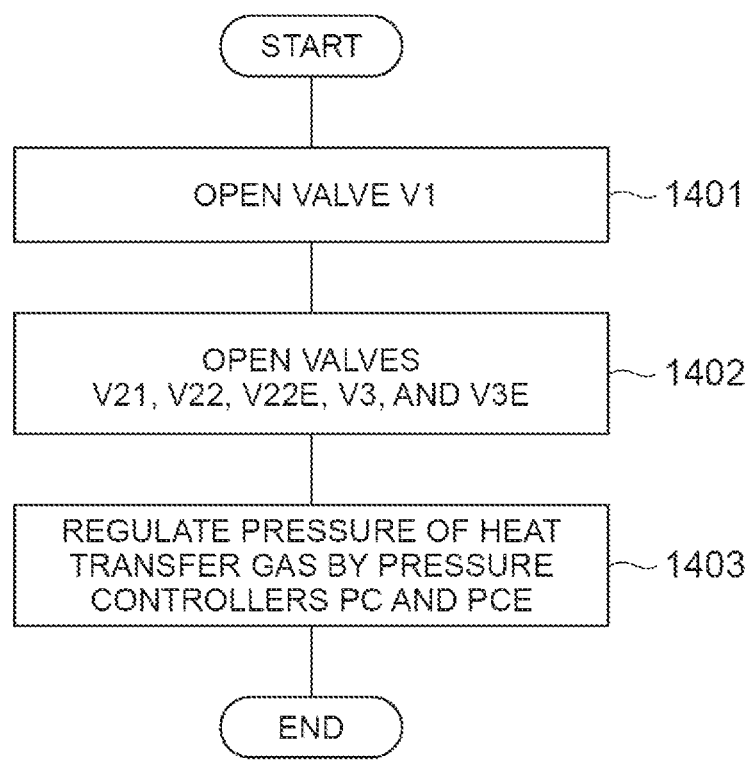
FIG. 14 is a flowchart showing a gas supply sequence according to still another exemplary embodiment.

FIG. 14 is a flowchart showing a gas supply sequence according to still another exemplary embodiment. As shown in FIG. 14, in the gas supply sequence applied to the gas supply system 50E, first, the valve V1 is opened (step 1401). Then, the valve V21, the valve V22, the valve V22E, the valve V3, and the valve V3E are opened (step 1402). It should be noted that the valves V4 and V4E are closed while the gas supply sequence is being executed. Then, the pressure of the heat transfer gas is controlled by the pressure controllers PC and PCE (step 1403). During the execution of the gas supply sequence, the pump PU is operated to return a part of the heat transfer gas from the second portions P2 and P2E to the first portion P1. By the gas supply sequence, the heat transfer gas at the designated pressure is supplied to the gap between the substrate support 11 and the back surface of the substrate W. In addition, a part of the heat transfer gas is returned from the second portions P2 and P2E to the first portion P1 through the gas recovery lines 52 and 52E.

In the gas stop sequence applied to the gas supply system 50E, each section of the gas supply system 50E can be controlled by the controller 2. By executing the gas stop sequence, the supply of the heat transfer gas by the gas supply system 50E is stopped.

Figure 15:
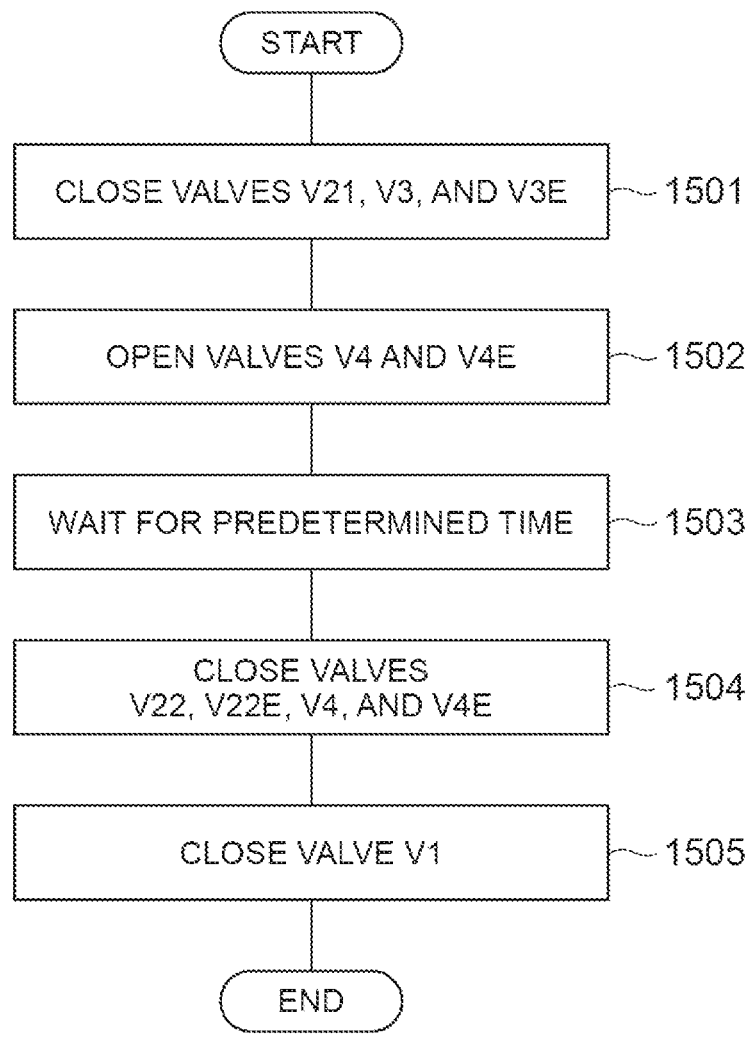
FIG. 15 is a flowchart showing a gas stop sequence according to still another exemplary embodiment.

FIG. 15 is a flowchart showing a gas stop sequence according to still another exemplary embodiment. As shown in FIG. 15, in the gas stop sequence applied to the gas supply system 50E, the valve V21, the valve V3, and the valve V3E are first closed (step 1501). Then, the valves V4 and V4E are opened (step 1502). After waiting for a desired time (step 1503), the valve V22, the valve V22E, the valve V4, and the valve V4E are closed (step 1504). Then, the valve V1 is closed (step 1505). During the execution of the gas stop sequence, the pump PU is operated to return the heat transfer gas to the first portion P1. By the gas stop sequence, the supply of the heat transfer gas to the gap between the substrate support 11 and the back surface of the substrate W is stopped. In addition, the heat transfer gas inside the second portions P2 and P2E, the third portions P3 and P3E, and the gas recovery lines 52 and 52E of the gas supply system 50 is returned to the inside of the first portion P1 (for example, the tank TA).

Figure 16:
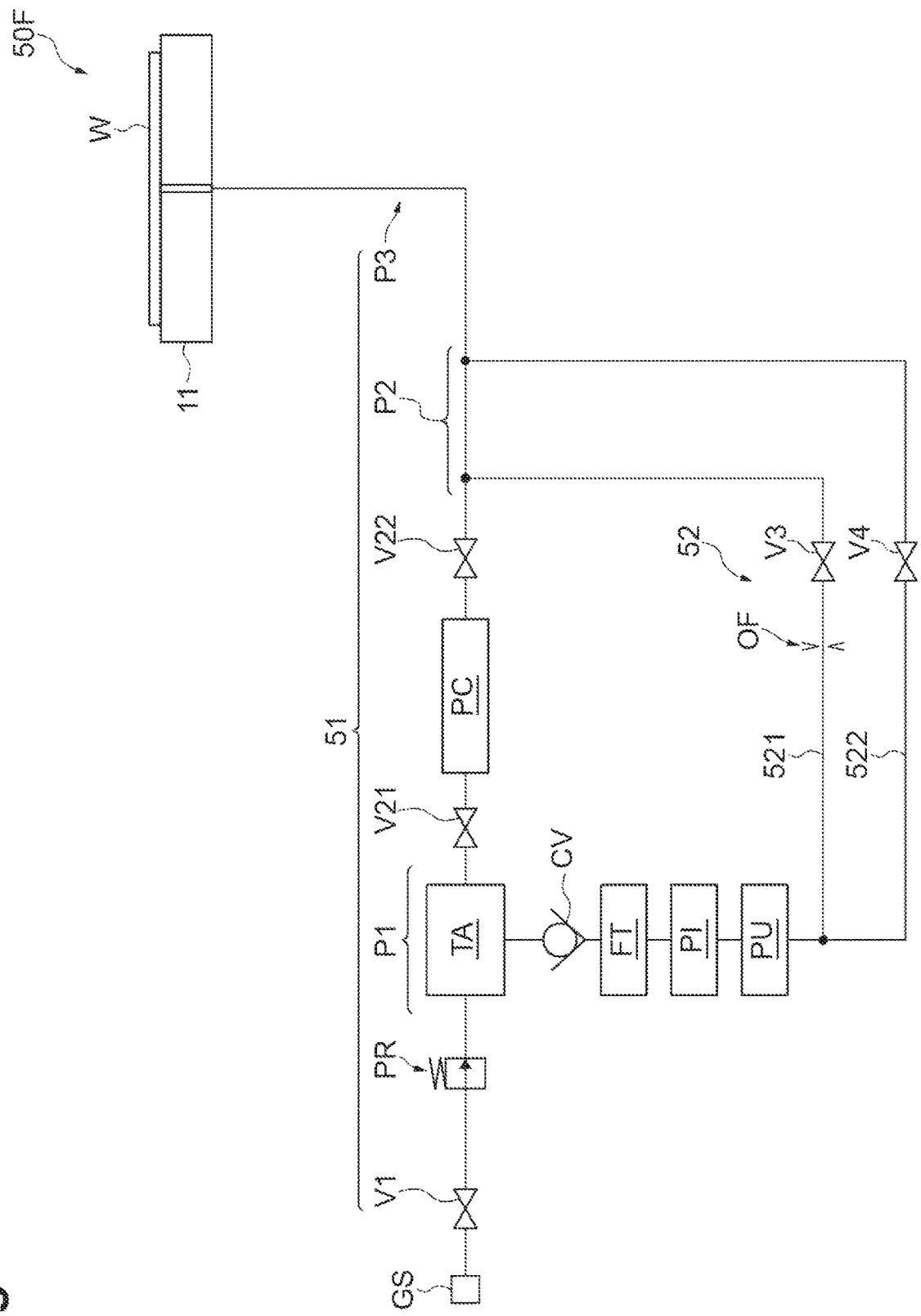
FIG. 16 is a diagram showing a gas supply system according to still another exemplary embodiment.

Hereinafter, the description is made with reference to FIG. 16. FIG. 16 is a diagram showing a gas supply system according to still another exemplary embodiment. A gas supply system 50F shown in FIG. 16 is different from the gas supply system 50 in that the gas supply system 50F further includes a pressure booster P1, a filter FT, and a check valve CV. The pressure booster P1, the filter FT, and the check valve CV are connected between the pump PU and the first portion P1 (for example, the tank TA). The pump PU may be a turbo-molecular pump. It should be noted that each of the gas supply systems according to the various embodiments described above may further include the pressure booster P1, the filter FT, and the check valve CV, as in the gas supply system 50F.

The pressure booster P1 boosts the pressure of the gas recovered by the gas recovery line 52. The gas of which the pressure is boosted by the pressure booster P1 is returned to the first portion P1 (for example, the tank TA). The pressure booster P1 may be a dry pump, a compressor, or the like. The check valve CV is provided to prevent a backflow of the gas from the gas supply line 51 to the gas recovery line 52. The filter FT is connected between the check valve CV and the pressure booster P1. The filter FT is configured to capture and remove components other than the heat transfer gas. The components removed by the filter FT can include oil of the pressure booster P1, mechanical dust of an exhaust system, dust from the back surface of the substrate and the substrate support (for example, an electrostatic chuck), an outgas from an inside of a pipe, a residual gas inside the chamber, and the like.

While various exemplary embodiments have been described above, various additions, omissions, substitutions and changes may be made without being limited to the exemplary embodiments described above. Elements of the different embodiments may be combined to form another embodiment.

For example, the gas supply systems according to the various embodiments described above may be adopted in other substrate processing apparatuses other than the plasma processing apparatus.

In addition, although the gas supply system 50E includes two gas supply lines and two gas recovery lines, in other embodiments, the gas supply system may include three or more gas supply lines and three or more gas recovery lines.

In addition, an exhaust apparatus may be connected to the second recovery line 522 between the valve V4 and the pump PU. Further, at least one other gas supply line may be connected to the gas flow path of the gas supply line 51 between the valve V21 and the pressure controller PC. The at least one other gas supply line is provided to supply the heat transfer gas to a gap between the substrate support of at least one other substrate processing apparatus and the back surface of the substrate. The at least one other gas supply line may include the pressure controller, the valve, the second portion, and a third portion, as in the gas supply line 51. The pressure controller, the valve, the second portion, and the third portion in the at least one other gas supply line are connected between the valve V21 and the gap between the substrate support of the at least one other substrate processing apparatus and the back surface of the substrate. In addition, as in the gas recovery line 52, the first recovery line and the second recovery line may be connected between the second portion and the pump PU in the at least one other gas supply line.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

REFERENCE SIGNS LIST

1: plasma processing apparatus
2: controller
11: substrate support
50: gas supply system
51: gas supply line
P1: first portion
P2: second portion
P3: third portion
PC: pressure controller
52: gas recovery line
PU: pump

The invention claimed is:

1. A gas supply system comprising:
a gas supply line; and
a gas recovery line,
wherein the gas supply line supplies a heat transfer gas to a gap between a substrate support and a back surface of a substrate,
the gas supply line includes
  a first portion,
  a second portion downstream of the first portion,
  a pressure controller configured to regulate a pressure of the heat transfer gas and connected between the first portion and the second portion, and
  a third portion that connects the second portion and the gap,
the gas recovery line is connected to the first portion and the second portion, includes a pump that is connected between the first portion and the second portion, shares the third portion with the gas supply line, and is configured to return the heat transfer gas from the second portion to the first portion, and
the gas recovery line further includes
  a gas flow path connected between the second portion and the pump,
  an orifice that reduces a cross-sectional area of the gas flow path, and
  another gas flow path connected between the second portion and the pump.

2. The gas supply system according to claim 1, wherein the third portion includes a valve connected between the second portion and the substrate support.

3. The gas supply system according to claim 1, wherein the first portion includes a tank for storing the heat transfer gas, and
the gas recovery line is configured to return the heat transfer gas to the tank.

4. The gas supply system according to claim 1, further comprising:
a pressure regulator configured to regulate a pressure of the heat transfer gas in a portion upstream of the pressure controller in the gas supply line.

5. The gas supply system according to claim 4,
wherein the pressure regulator sets the pressure in the portion upstream of the pressure controller in the gas supply line to a pressure higher than a required supply pressure of the pressure controller.

6. The gas supply system according to claim 1,
wherein the gas recovery line further includes a pressure booster connected between the pump and the first portion and configured to boost a pressure of a gas recovered from the second portion.

7. The gas supply system according to claim 1,
wherein the gas recovery line further includes a check valve connected between the pump and the first portion.

8. The gas supply system according to claim 1,
wherein the gas recovery line further includes a filter connected between the pump and the first portion.

9. An operation method for the gas supply system according to claim 1, the operation method comprising:
supplying the heat transfer gas to the gap through the gas supply line; and
recovering a part of the heat transfer gas from the second portion to the first portion through the gas recovery line when the heat transfer gas is supplied to the gap.

10. A substrate processing apparatus comprising:
a substrate support configured to support a substrate placed thereon; and
the gas supply system according to claim 1 configured to supply a heat transfer gas to a gap between the substrate support and a back surface of the substrate.

11. A gas supply system comprising:
a gas supply line; and
a gas recovery line,
wherein the gas supply line supplies a heat transfer gas to a gap between a substrate support and a back surface of a substrate,
the gas supply line includes
a first portion,
a second portion downstream of the first portion,
a pressure controller configured to regulate a pressure of the heat transfer gas and connected between the first portion and the second portion, and
a third portion that connects the second portion and the gap,
the gas recovery line is connected to the first portion and the second portion, includes a pump that is connected between the first portion and the second portion, shares the third portion with the gas supply line, and is configured to return the heat transfer gas from the second portion to the first portion,
the first portion includes a tank for storing the heat transfer gas,
the gas recovery line is configured to return the heat transfer gas to the tank,
the gas supply system further comprises a pressure regulator configured to regulate a pressure of the heat transfer gas in a portion upstream of the pressure controller in the gas supply line, and
the pressure regulator includes
a pressure gauge configured to measure a pressure of the heat transfer gas inside the tank, and
a valve connected between a source of the heat transfer gas and the first portion, and opened and closed according to the pressure measured by the pressure gauge.

12. The gas supply system according to claim 11,
wherein the gas recovery line further includes
a gas flow path connected between the second portion and the pump, and
a valve configured to regulate an opening degree of the gas flow path.

13. The gas supply system according to claim 12,
wherein the opening degree of the valve is set to an opening degree smaller than full opening when the heat transfer gas is supplied from the gas supply line to the gap.

14. A gas supply system comprising:
a gas supply line; and
a gas recovery line,
wherein the gas supply line supplies a heat transfer gas to a gap between a substrate support and a back surface of a substrate,
the gas supply line includes
a first portion,
a second portion downstream of the first portion,
a pressure controller configured to regulate a pressure of the heat transfer gas and connected between the first portion and the second portion, and
a third portion that connects the second portion and the gap,
the gas recovery line is connected to the first portion and the second portion, includes a pump that is connected between the first portion and the second portion, shares the third portion with the gas supply line, and is configured to return the heat transfer gas from the second portion to the first portion,
the gas supply system further comprises:
an other gas supply line that supplies the heat transfer gas to the gap and includes the first portion, an other second portion downstream of the first portion, an other pressure controller configured to regulate the pressure of the heat transfer gas and connected between the first portion and the other second portion, and an other third portion that connects the other second portion and the gap; and
an other gas recovery line that connects the first portion and the other second portion, includes the pump connected between the first portion and the other second portion, and is configured to return the heat transfer gas from the other second portion to the first portion.

* * * * *